(12) United States Patent
Ujikane et al.

(10) Patent No.: US 11,784,644 B2
(45) Date of Patent: Oct. 10, 2023

(54) ROTATION DETECTOR AND IMAGING DEVICE

(71) Applicant: Panasonic Intellectual Property Management Co., Ltd., Osaka (JP)

(72) Inventors: Yukikazu Ujikane, Osaka (JP); Koji Masuda, Kyoto (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 17/542,374

(22) Filed: Dec. 4, 2021

(65) Prior Publication Data

US 2023/0006670 A1  Jan. 5, 2023

(30) Foreign Application Priority Data

Jun. 30, 2021 (JP) ................................. 2021-108597

(51) Int. Cl.
*H03K 17/97* (2006.01)
*G01D 5/14* (2006.01)
*G05G 1/015* (2008.04)

(52) U.S. Cl.
CPC ............. *H03K 17/97* (2013.01); *G01D 5/145* (2013.01); *G05G 1/015* (2013.01); *H03K 2217/94068* (2013.01)

(58) Field of Classification Search
CPC ...... H03K 17/94; H03K 17/965; H03K 17/97; G01D 5/12; G01D 5/14–145; G05G 1/015
See application file for complete search history.

(56) References Cited

U.S. PATENT DOCUMENTS

| | | | | |
|---|---|---|---|---|
| 6,188,332 B1* | 2/2001 | Scarlata | ............... | H01H 19/005 345/184 |
| 7,378,842 B2* | 5/2008 | Babin | .................... | G01D 5/145 324/207.2 |
| 7,439,835 B2* | 10/2008 | Dietrich | ................. | G01D 5/145 324/207.2 |
| 2004/0196030 A1* | 10/2004 | Moreno | ................. | G01D 5/145 324/207.2 |
| 2005/0280411 A1* | 12/2005 | Bicking | .................. | G01B 7/14 324/207.21 |
| 2006/0156834 A1* | 7/2006 | Tokumoto | ............... | G01L 3/104 73/862.331 |

(Continued)

FOREIGN PATENT DOCUMENTS

| | | |
|---|---|---|
| JP | H01-134979 A | 5/1989 |
| JP | H03-044508 A | 2/1991 |

(Continued)

*Primary Examiner* — Giovanni Astacio-Oquendo
*Assistant Examiner* — David B Frederiksen
(74) *Attorney, Agent, or Firm* — Renner, Otto, Boisselle & Sklar, LLP

(57) ABSTRACT

A rotation detector includes a rotary member, a magnet rotating as the rotary member rotates, and a first magnetic sensor detecting a direction of magnetic flux that changes as the magnet rotates. And the rotation detector includes a first soft magnetic member and a second soft magnetic member for the first magnetic sensor that are arranged on one side and the other side, respectively, of a detection direction of the first magnetic sensor. The magnet has a rotation axis that passes through the magnet.

13 Claims, 13 Drawing Sheets

(56) References Cited

U.S. PATENT DOCUMENTS

| | | | | |
|---|---|---|---|---|
| 2010/0104275 | A1* | 4/2010 | Takeya | G02B 7/102 |
| | | | | 324/207.13 |
| 2016/0057321 | A1 | 2/2016 | Yamaura | |
| 2016/0216132 | A1* | 7/2016 | Ausserlechner | G01D 5/14 |
| 2016/0366339 | A1* | 12/2016 | Shimoyama | H02K 41/0356 |
| 2019/0287752 | A1* | 9/2019 | Hirayama | G03B 17/02 |
| 2021/0116231 | A1* | 4/2021 | Ausserlechner | G01D 5/145 |

FOREIGN PATENT DOCUMENTS

| | | |
|---|---|---|
| JP | H06-069732 U | 9/1994 |
| JP | 2003-294818 A | 10/2003 |
| JP | 2016-046024 A | 4/2016 |

\* cited by examiner

ROTATION DETECTOR AND IMAGING DEVICE

CROSS-REFERENCE TO RELATED APPLICATIONS

This is an application which claims priority of Japanese Patent Application No. 2021-108597 filed on Jun. 30, 2021, the content of which is incorporated herein by reference.

TECHNICAL FIELD

The present disclosure relates to a rotation detector capable of being arranged in electronic equipment such as a digital camera.

BACKGROUND

JP-2016-46024A discloses a rotary dial device that detects the amount of rotation of a dial as a rotary member rotating together with a magnet. This rotary dial device has high drip-proof performance and long life.

SUMMARY

However, the rotation detector may erroneously detect the amount of rotation of the rotary member, and it is therefore required to improve the detection accuracy.

The present disclosure provides a rotation detector improving the detection accuracy of the amount of rotation of the rotary member, and an imaging device including the rotation detector.

A rotation detector according to the present disclosure comprises: a rotary member; a magnet rotating as the rotary member rotates; a first magnetic sensor detecting a direction of magnetic flux that changes as the magnet rotates; and a first soft magnetic member and a second soft magnetic member for the first magnetic sensor that are arranged on one side and the other side, respectively, of a detection direction of the first magnetic sensor, the magnet having a rotation axis that passes through the magnet.

A rotation detector according to the present disclosure comprises: a rotary member; a magnet rotating as the rotary member rotates; a first magnetic sensor detecting a direction of magnetic flux that changes as the magnet rotates; a second magnetic sensor detecting a direction of magnetic flux that changes as the magnet rotates; a first soft magnetic member and a second soft magnetic member for the first magnetic sensor that are arranged on one side and the other side, respectively, of a detection direction of the first magnetic sensor; and a third soft magnetic member and a fourth soft magnetic member for the second magnetic sensor that are arranged on one side and the other side, respectively, of a detection direction of the second magnetic sensor. The magnet has a rotation axis that passes through the magnet, and the detection direction of the first magnetic sensor intersects the detection direction of the second magnetic sensor.

An imaging device according to the present disclosure comprises the rotation detector described above.

According to the present disclosure, there can be provided a rotation detector improving the detection accuracy of the amount of rotation of the rotary member, and an imaging device including the rotation detector.

DESCRIPTION OF THE PREFERRED EMBODIMENTS

An embodiment will hereinafter be described in detail with proper reference to the drawings. Note however that more detailed description than necessary may be omitted. For example, detailed description of already well-known matters and duplicated description for substantially the same configuration may be omitted. This is for the purpose of preventing the following description from becoming unnecessarily redundant, to thereby facilitate the understanding of those skilled in the art. The accompanying drawings and the following description are provided in order to allow those skilled in the art to fully understand the present disclosure, and it is not intended to limit thereby the subject matters defined in the appended claims.

Figure 20:
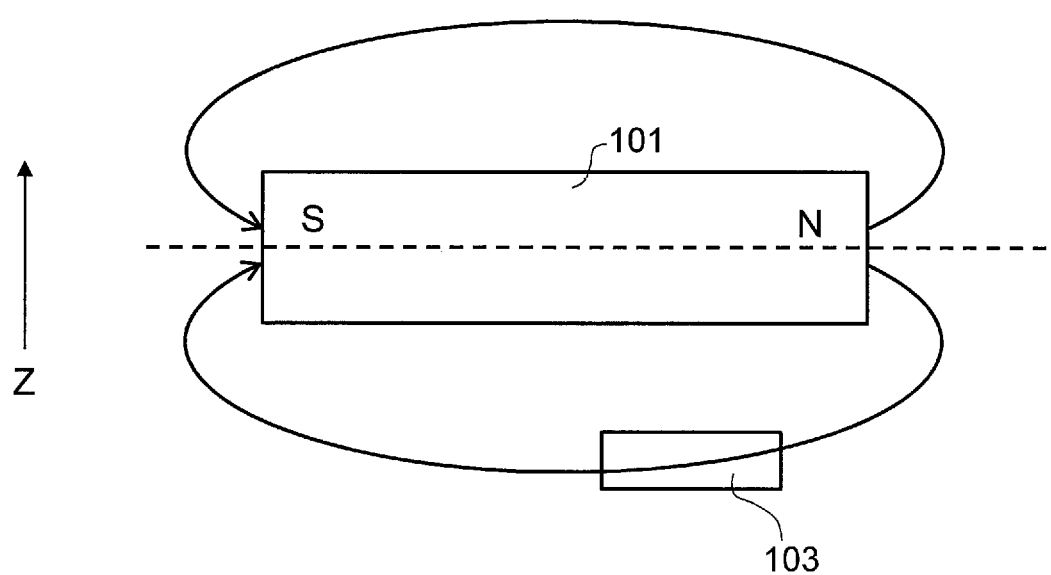
FIG. 20 is a longitudinal sectional view explaining the magnetic field direction of the normal magnet.
Figure 21:
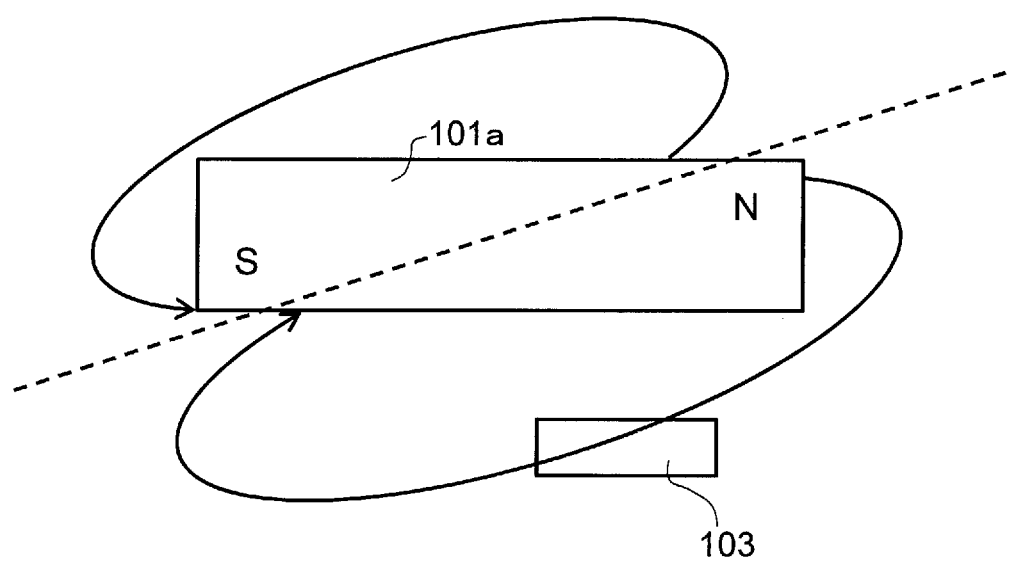
FIG. 21 is a longitudinal sectional view explaining the magnetic field direction of the abnormal magnet.

A task of a rotation detector of the present disclosure will first be described in detail with reference to FIGS. 20 and 21. FIG. 20 is a longitudinal sectional view explaining the magnetic field direction of a normal magnet 101. FIG. 21 is a longitudinal sectional view explaining the magnetic field direction of an abnormal magnet 101a.

As shown in FIG. 20, in the magnetic field of the normal magnet 101, magnetic flux is generated from N pole toward S pole at a central portion in the thickness direction. For example, a magnetic sensor 103 is arranged below the magnet 101, with its detection direction being adapted so as to be able to detect this magnetic flux.

Even with this arrangement, however, a case was discovered where the magnetic sensor 103 could not detect the magnetic flux of the magnet 101. When the inventors investigated the cause, it was newly found that in the case of a defective detection there was a deviation in the direction of magnetic flux of the magnet 101a, as in FIG. 21, compared with the normal magnet 101. In FIG. 21, for example, the direction of magnetic flux deviates in the thickness direction of the magnet 101a. In the case that such an abnormal magnet 101a is used, a state occurs in which the magnetic flux does not pass in the detection direction of the magnetic sensor 103, whereupon the rotation position of the magnet 101a, which should be originally detected, cannot be properly detected.

In the following embodiment, description will be given of a rotation detector improving the detection accuracy of the amount of rotation even in the case of using such an abnormal magnet 101a. In the following embodiment, a digital camera will be described as an example of equipment mounted with the rotation detector according to the present disclosure.

EMBODIMENT 1-1. Overall Configuration

Figure 1:
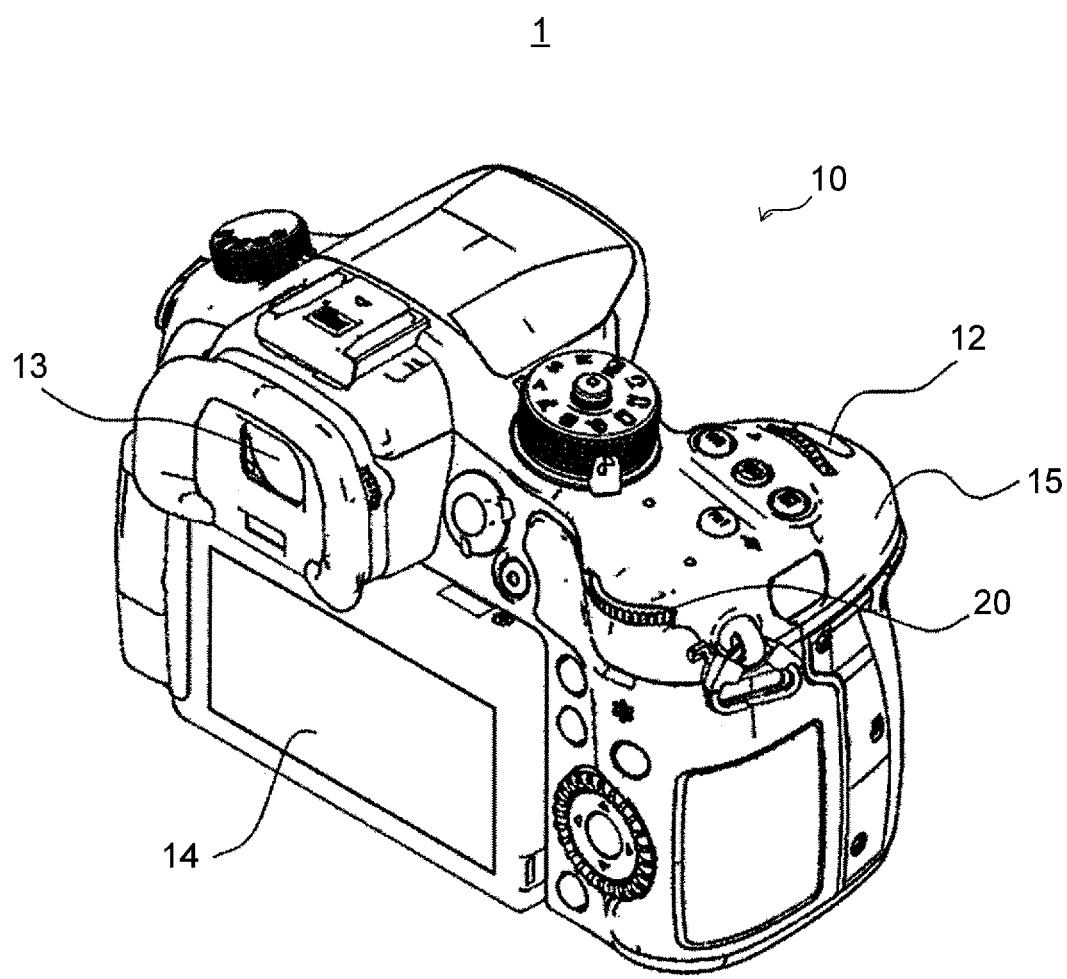
FIG. 1 is a back perspective view of a camera body of an embodiment of the present disclosure.

FIG. 1 is a rear perspective view of a digital camera 1 according to the embodiment. In FIG. 1, a camera body 10 is depicted with its interchangeable lens removed not shown. The camera body 10 according to the embodiment includes a release button 12, an electronic view finder (EVF) 13, a monitor 14, a casing 15, and a rotary dial unit 20.

In the following description, the top surface side of the digital camera is referred to as the top side (Z-axis positive direction). In the following description, the direction opposite to the top side is referred to as the bottom side (Z-axis negative direction).

The release button 12 is a two-step push-type button that is half-pressed and fully-pressed. When the release button 12 is half-pressed by the user, the digital camera determines shooting conditions. Subsequently, when the release button 12 is fully-pressed by the user, the digital camera performs shooting processing. The digital camera records image data imaged on an imaging element through the interchangeable lens, as a still image, onto a memory card or the like at the timing of full pressing.

The EVF 13 is a device that displays an image, etc. acquired by the imaging element. An eye contact detecting unit is disposed in the vicinity of the EVF 13. The digital camera selects whether to display the image on the EVF 13 or on the monitor 14, depending on the detection result of the eye contact detecting unit.

The monitor 14 is a device that displays an image, etc. acquired by the imaging element. The monitor 14 and the EVF 13 can display shooting conditions such as a shutter speed and an aperture value, in addition to the image acquired by the imaging element.

The casing 15 holds the elements of the camera body 10 on the outer peripheral surface or inside. The housing is molded from metal or resin and prevents water and dust from entering the camera body 10.

The rotary dial unit 20 is a rotary operation system arranged on the back surface of the camera body 10. The rotary dial unit 20 is rotary operation means for adjusting the shutter speed and the aperture value. By the user rotating the rotary dial unit 20, it is possible to set a desired shutter speed and aperture value. The rotary dial unit 20 of this embodiment is referred to also as a rear dial. The direction of rotation and the amount of rotation of the rotary dial unit 20 are detected by a rotation detector 30 (see FIG. 2, etc.).

1-2. Rotation Detector

Figure 2:
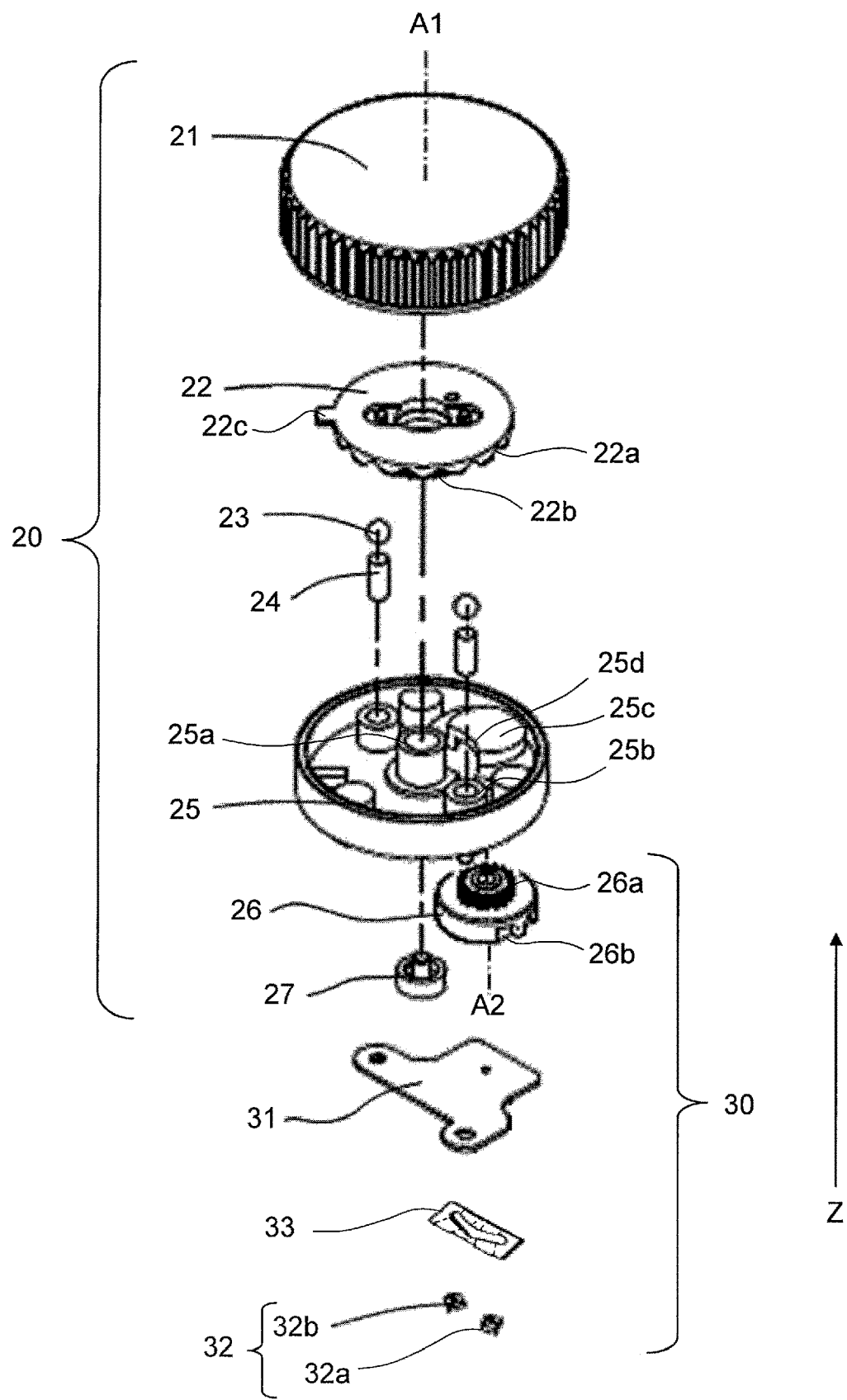
FIG. 2 is an exploded perspective view of a rotary dial of the camera body.

FIG. 2 is a perspective view of the rotary dial unit 20 and the rotation detector 30 according to the embodiment. The rotary dial unit 20 includes a dial 21, a click plate 22, a click ball 23, a click spring 24, a dial holder 25, and a retainer 27. The rotation detector 30 includes a magnet holder 26, a substrate 31, a magnetic detecting unit 32, and a sheet 33. The constituent elements of the rotary dial unit 20 will first be described.

The dial 21 is formed in a substantially cylindrical shape. The dial 21 has at its bottom side a protrusion (shaft) that is inserted through a dial bearing 25a formed on the dial holder 25. The dial 21 is rotatable around an axis A1 relative to the dial holder 25. The dial 21 has on its outer peripheral surface a plurality of knurls that offer a non-slip function when the user rotates the rotary dial unit 20.

The click plate 22 is a plate-shaped member made of metal or the like. The click plate 22 has a click groove 22a formed on a circumference thereof. The click groove 22a is smoothly alternately concaved and convexed. A first gear 22b is held on the bottom side of the click plate 22 so as to rotate around the axis A1 together with the dial 21. The click plate 22 has at its circumference a protrusion 22c for positioning that engages with a groove formed inside the dial 21. The first gear 22b may be formed integrally with the click plate 22.

The click ball 23 is a spherical member. The click ball 23 is urged upward by the click spring 24 in a spring holding portion 25b formed on the dial holder 25.

The click spring 24 is a resilient member. The click spring 24 urges the click ball 23 upward in the spring holding portion 25b formed on the dial holder 25.

The dial holder 25 is a substantially cylindrical member molded from resin or the like. The interior of the dial holder 25 is formed with the dial bearing 25a, the spring holding portion 25b, and a gear base plate 25c. The dial bearing 25a is hollowly formed in a substantially cylindrical shape. The dial bearing 25a receives and holds a shaft formed on the dial 21. The spring holding portion 25b is hollowly formed in a substantially cylindrical shape. The spring holding portion 25b internally holds the click spring 24 and the click ball 23. The spring holding portion 25b is formed high enough to hold the click spring 24 and the click ball 23 so as to prevent the click ball 23 from coming out of the spring holding portion 25b. The gear base plate 25c is formed in a substantially cylindrical shape in the dial holder 25 and holds the magnet holder 26 rotatably around an axis A2 that is a rotation axis. The gear base plate 25c has a notch 25d on a part of the lateral surface facing the dial bearing 25a. The notch 25d allows a partial exposure of a second gear 26a that will be described later.

The retainer 27 is a substantially cylindrical member having a recess at the center thereof. After engagement of the recess formed at the center with the shaft of the dial 21, the retainer 27 is screwed thereto from below.

The constituent elements of the rotation detector 30 will then be described.

The magnet holder 26 is a substantially cylindrical member molded from resin or the like. The magnet holder 26 holds the second gear 26a integrally on the top side thereof. The magnet holder 26 holds a magnet 26b integrally on the bottom side thereof. Holding the magnet 26b can be implemented by sticking with e.g. a double-sided tape or the like. By the second gear 26a rotating around the axis A2, the magnet holder 26 and the magnet 26b rotate as one. The magnet holder 26 has on its bottom side a notch or the like for positioning the magnet 26b. The second gear 26a may be formed integrally with the magnet holder 26.

The substrate 31 has an electric circuit formed on one surface or both surfaces thereof. The magnetic detecting unit 32 is fixed to the bottom side of the substrate 31 by e.g. soldering. The magnetic detecting unit 32 is a sensor measuring the magnitude and direction of the magnetic field and can be implemented with a magnetoresistive effect element or the like. The substrate 31 has a circuit formed thereon for transmitting a detection signal acquired from the magnetic detecting unit 32 to a control unit of the digital camera.

The relationship of arrangement between the constituent elements will then be described.

The shaft formed on the bottom side of the dial 21 engages with the dial bearing 25a. The dial 21 is screwed to the retainer 27 while being inserted into the dial bearing 25a. As a result, the dial 21 is held rotatably relative to the dial holder 25.

The click plate 22 is held on the dial 21. Because the protrusion 22c fits into a groove (not shown) formed on the dial 21, it is suppressed that there occurs a phase shift between the click plate 22 and the dial 21. That is, the click plate 22 rotates around the axis A1 together with the dial 21.

The dial holder 25 is held by a wall portion (not shown). In consequence, the dial holder 25 is restrained from rotating relative to the wall portion.

The click ball 23 is urged upward by the click spring 24 and comes into contact with the click groove 22a formed on the click plate 22. The click groove 22a is a smoothly alternately concaved and convexed so that the click ball 23 moves along this groove when the user rotates the dial 21. This gives the user a click feel.

Figure 3:
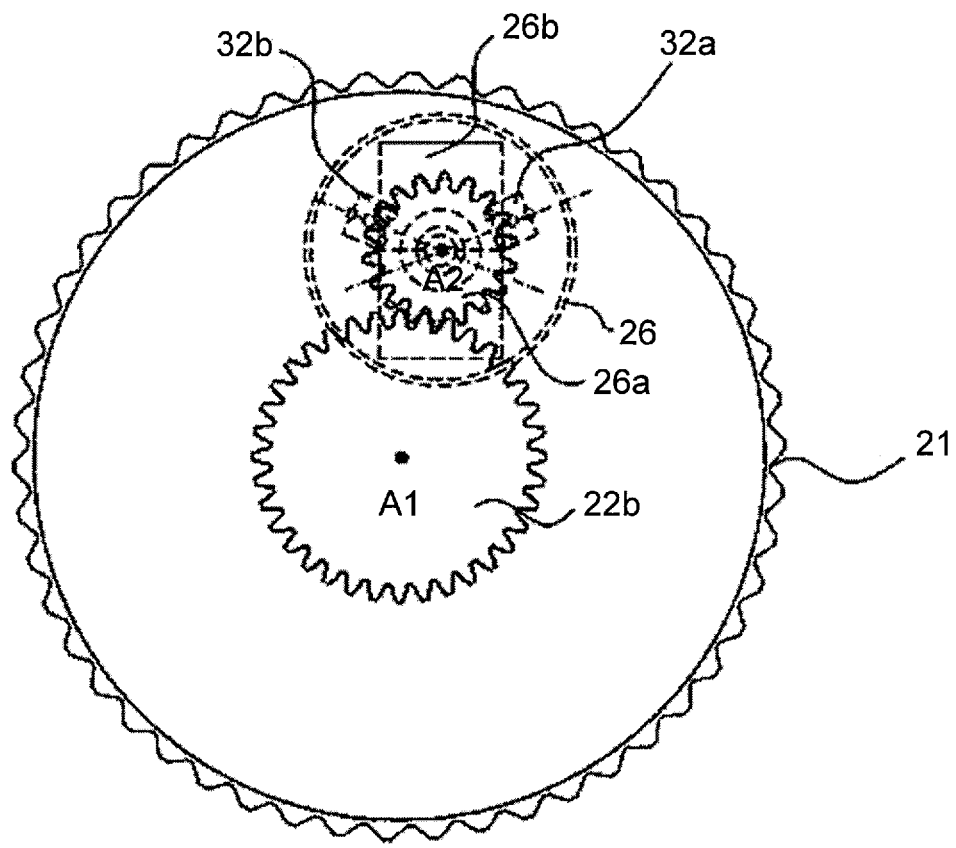
FIG. 3 is a top view for explaining a speed increasing mechanism of the rotary dial and a rotation detection method.

Reference is then made to FIGS. 2 and 3. FIG. 3 is a top view for explaining a speed increasing mechanism of the rotary dial and a rotation detection method, according to the embodiment.

The dial holder 25 includes the gear base plate 25c that has the notch 25d and a gear rotation shaft extending downward. The magnet holder 26 rotates on the gear rotation shaft around the axis A2. In the notch 25d, the second gear 26a is partially exposed from the gear base plate 25c so that the first gear 22b and the second gear 26a mesh with each other. This allows the second gear 26a to rotate with the rotation of the first gear 22b.

The magnet holder 26 is rotatably held by the dial holder 25. The second gear 26a is formed on the top side of the magnet holder 26. The magnet holder 26 integrally holds the magnet 26b. As a result, the magnet 26b rotates with the rotation of the second gear 26a.

In the embodiment, the magnetic detecting unit 32 includes a first magnetic sensor 32a and a second magnetic sensor 32b. Although magnetoresistive (MR) elements for example are used as the first magnetic sensor 32a and the second magnetic sensor 32b, Hall elements may be used. Straight lines (one-dotted chain lines) joining the axis A2 and respective centers of the first magnetic sensor 32a and second magnetic sensor 32b have a tilt angle of 45 degrees. In other words, the first magnetic sensor 32a and the second magnetic sensor 32b are arranged in a positional relationship where their respective detection directions are tilted 45 degrees with respect to a rotation axis Y.

In the embodiment, the first magnetic sensor 32a and the second magnetic sensor 32b are arranged on the same plane so that the respective detection directions of the first magnetic sensor 32a and the second magnetic sensor 32b intersect with each other in the same plane. As used herein, being arranged on the same plane includes not only the case where the first magnetic sensor 32a and the second magnetic sensor 32b lie perfectly on the same plane but also the case where they are arranged with some deviation in the Z-axis direction. For example, the case is also included where there is a deviation of the order of the thickness of the magnetic sensor. The first magnetic sensor 32a and the second magnetic sensor 32b are each positioned away from the rotation center A2 of the magnet 26b. This enables the rotation detector 30 to have a smaller thickness in the direction of the axis A2. The first magnetic sensor 32a and the second magnetic sensor 32b are each arranged apart from the magnet 26b in the direction orthogonal to the rotation plane of the magnet 26b.

Figure 4:
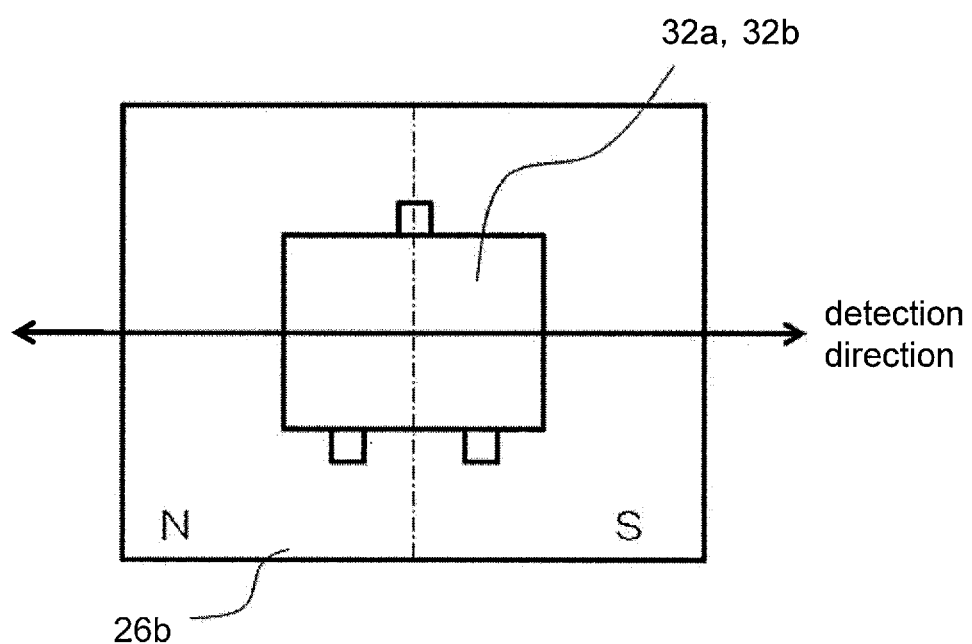
FIG. 4 is a diagrammatic view for explaining a general principle of rotation detection using a magnetic sensor.
Figure 5:
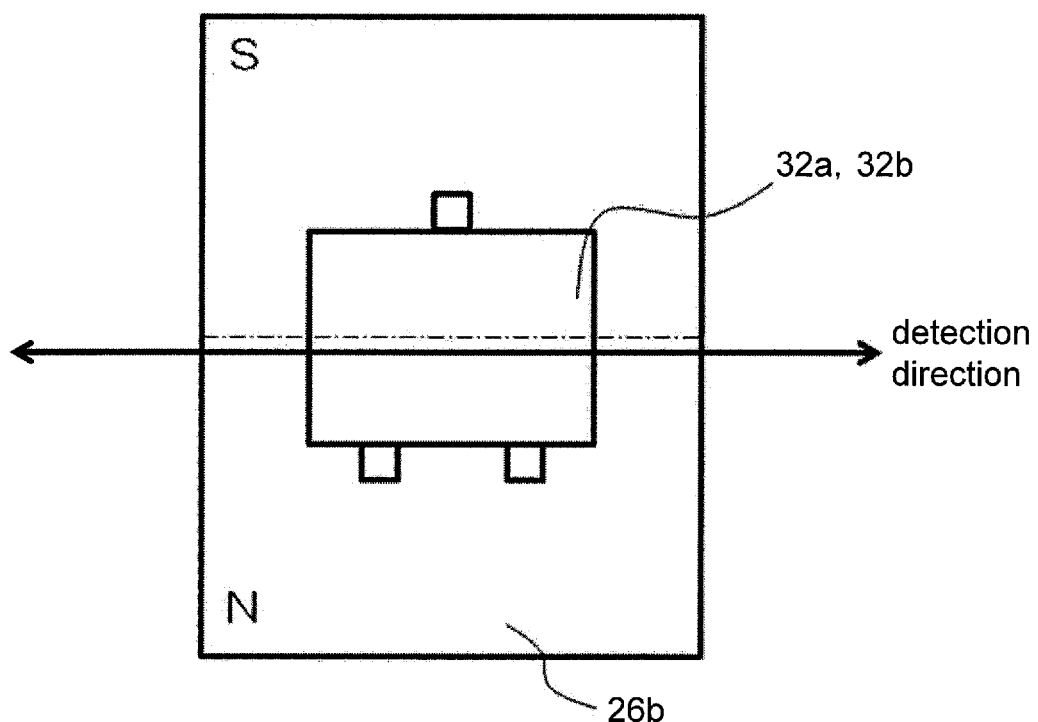
FIG. 5 is a diagrammatic view for explaining a general principle of rotation detection using the magnetic sensor.

Reference is then made to FIGS. 4 and 5. FIGS. 4 and 5 are diagrammatic views for explaining a general principle of rotation detection using the first and second magnetic sensors 32a and 32b, that is used in the embodiment. In the embodiment, the detection direction of the magnetic sensor is defined as being the direction of magnetic flux that the detection circuit outputs an ON signal. The first and second magnetic sensors 32a and 32b have their respective detection directions and, for example, the first and second magnetic sensors 32a and 32b are each arranged such that the respective detection directions of the first and second magnetic sensors 32a and 32b are parallel to the plane on which the magnet 26b rotates. As shown in FIG. 4, the first and second magnetic sensors 32a and 32b issue the ON signal as their respective outputs when magnetic flux parallel to the detection direction is applied, whereas as shown in FIG. 5 they provide no outputs (OFF signal) when magnetic flux perpendicular to the detection direction is applied. A single magnetic sensor can only detect changes in the direction of magnetic flux in 90 degree increments.

Although the changes in the direction of magnetic flux detectable by a single magnetic sensor are in 90 degree increments in this manner, it becomes possible to detect the rotation of the magnet 26b in 45 degree increments by arranging the two magnetic sensors, i.e. the first and second magnetic sensors 32a and 32b with their respective detection directions tilted 45 degrees as shown in FIG. 3. The magnet 26b is integrally held by the magnet holder 26, and the second gear 26a formed on the magnet holder 26 meshes with the first gear 22b with a gear ratio of 1:2. That is, the number of teeth of the first gear 22b is twice that of the second gear 26a. Consequently, the dial 21 integrally holding the first gear 22b rotates 22.5 degrees when the magnet 26b rotates 45 degrees. Thus, this configuration enables the two magnetic sensors to detect the rotation of the dial 21 in 22.5 degree increments.

Figure 6:
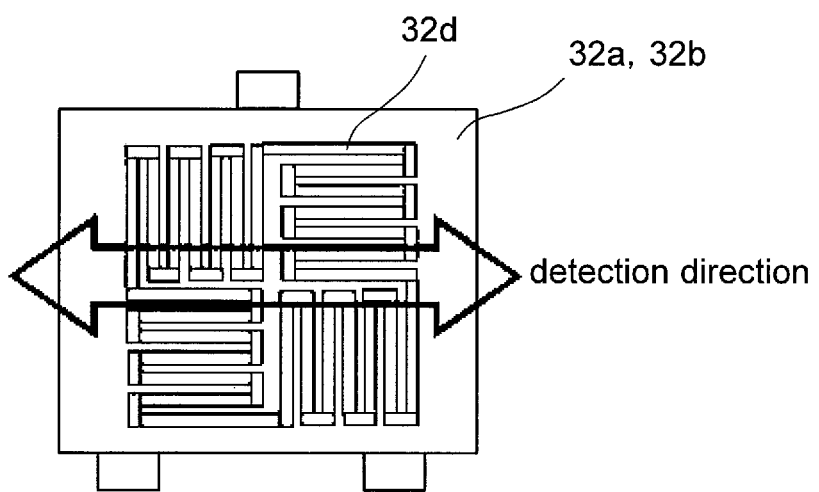
FIG. 6 is an explanatory view for explaining a detection surface of the magnetic sensor.

As shown in FIG. 6, the first and second magnetic sensors 32a and 32b are magnetoresistive element having a detection circuit 32d that detects magnetic flux. The detection circuit 32d has e.g. four different resistance patterns, and the resistance changes in the case of a magnetic field perpendicular to the current direction. By comparing the potential difference caused by the change in resistance with the threshold value, the sensors output the ON signal or the OFF signal.

Figure 7:
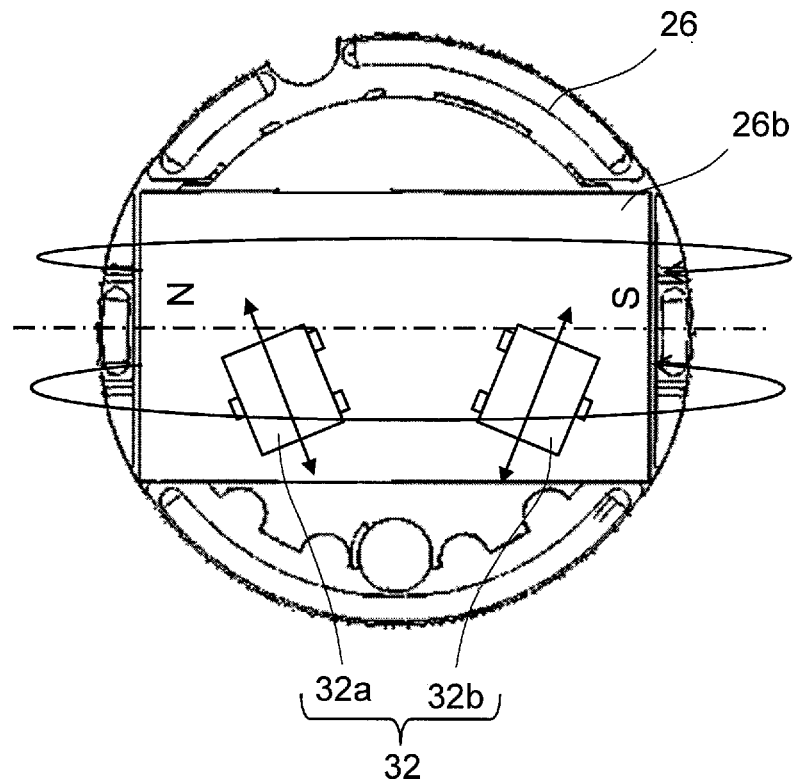
FIG. 7 is a bottom view showing a positional relationship between a magnetic detecting unit and a magnet and magnet holder.
Figure 8:
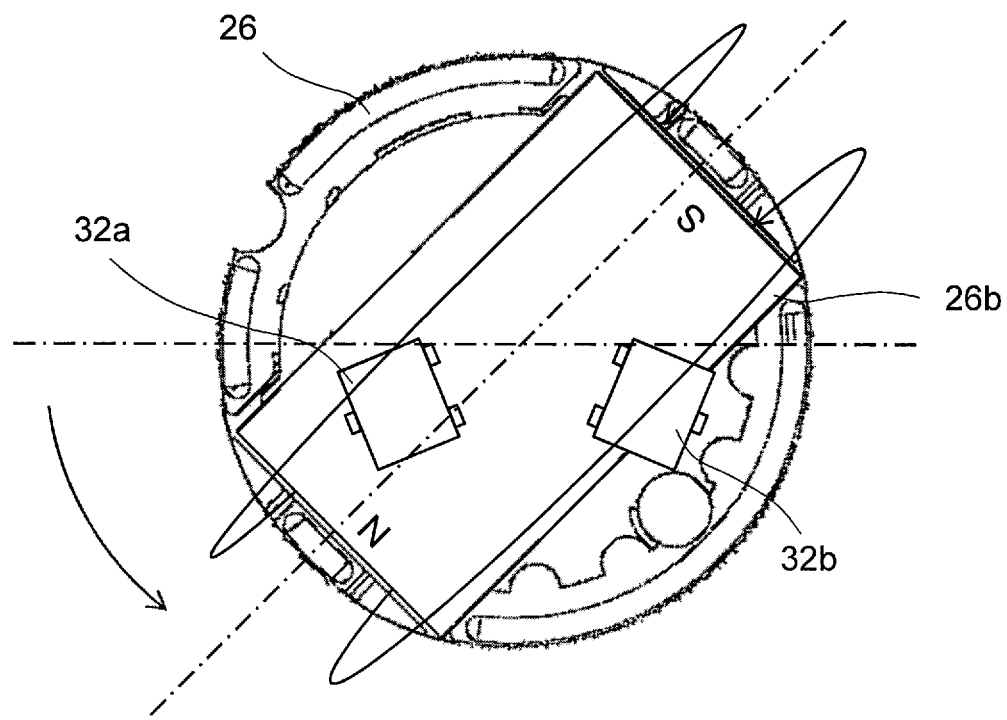
FIG. 8 is a bottom view showing a positional relationship between the magnetic detecting unit and the magnet and magnet holder.
Figure 9:
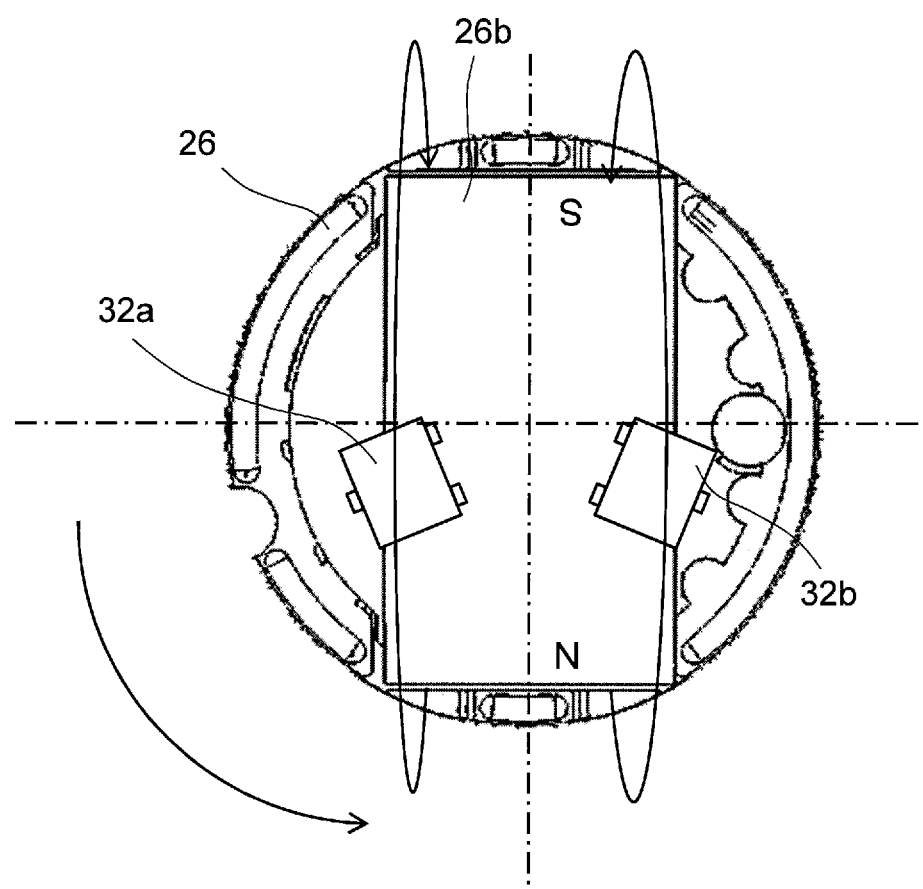
FIG. 9 is a bottom view showing a positional relationship between the magnetic detecting unit and the magnet and magnet holder.

FIGS. 7 to 9 are bottom views showing positional relationships between the magnetic detecting unit 32 and the magnet 26b and magnet holder 26. In FIG. 7, when the magnet holder 26 and the magnet 26b are at their initial position, e.g. a position where the amount of rotation is 0 degrees, the magnetic flux of the magnet 26b intersects both the detection directions of the first and second magnetic sensors 32a and 32b, with the result that output signals from the first and second magnetic sensors 32a and 32b are OFF signals.

In FIG. 8, the magnet holder 26 and the magnet 26b are in a state of being rotated by 45 degrees from their initial position. When the amount of rotation of is 45 degrees, the magnetic flux of the magnet 26b intersects the detection direction of the first magnetic sensor 32a but lies within the range of the detection direction of the second magnetic sensor 32b. Accordingly, the output signal from the first magnetic sensor 32a is the OFF signal, while the output signal from the second magnetic sensor 32b is the ON signal.

In FIG. 9, the magnet holder 26 and the magnet 26b are in a state of being rotated by 90 degrees from their initial position. When the amount of rotation is 90 degrees, the magnetic flux of the magnet 26b lies within the ranges of the detection directions of the first and second magnetic sensors 32a and 32b. Therefore, the output signals from the first and second magnetic sensors 32a and 32b are both the ON signals. By combinations of the output signals from the first and second magnetic sensors 32a and 32b in this manner, the amount of rotation of the first and second magnetic sensors 32a and 32b can be detected in 45 degree increments.

1-3. Soft Magnetic Member

Figure 10:
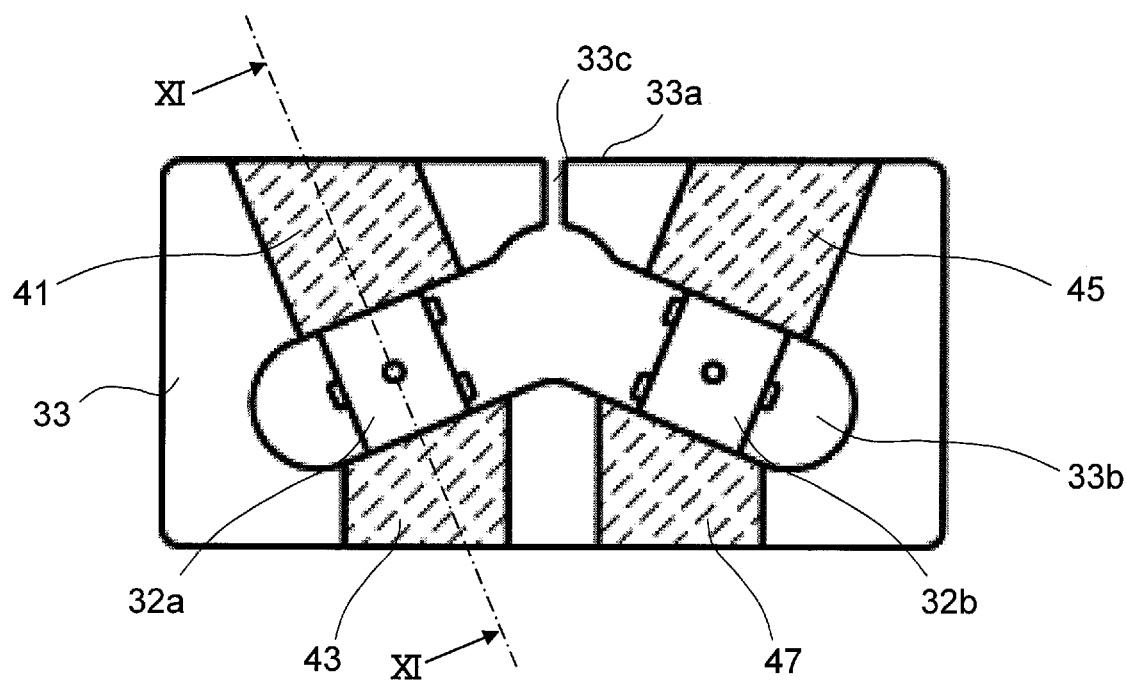
FIG. 10 is a bottom view showing the magnetic sensor and a sheet.
Figure 11:
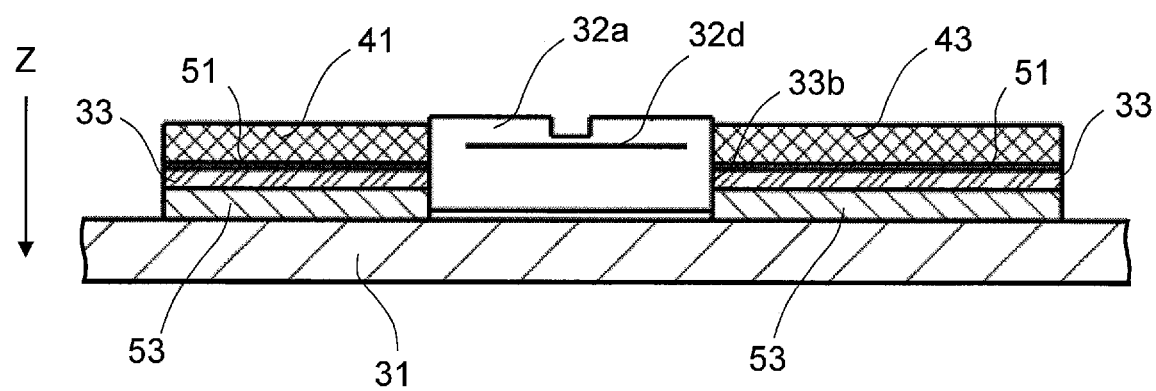
FIG. 11 is a sectional view taken along line XI of FIG. 10.

Referring then to FIGS. 10 and 11, the sheet 33 will be described that encompasses the first and second magnetic sensors 32a and 32b. FIG. 10 is a bottom view showing the magnetic sensor and the sheet 33. FIG. 11 is a sectional view taken along line XI of FIG. 10. A soft magnetic member aligning the direction of magnetic flux is arranged on the sheet 33.

The sheet 33 has e.g. a substantially rectangular shape with four sides, but may be of other shapes such as a circular shape and a triangular shape. The sheet 33 has an opening 33b at a central portion thereof, with a slit 33c extending from an outer edge 33a of the sheet 33 to the opening 33b. The sheet 33 is made of resin for example. The first and second magnetic sensors 32a and 32b are arranged in the opening 33b of the sheet 33.

A first soft magnetic member 41 is arranged on one side of the detection direction of the first magnetic sensor 32a. A second soft magnetic member 43 is arranged on the other side of the detection direction of the first magnetic sensor 32a. The first and second soft magnetic members 41 and 43 align the direction of magnetic flux around the first magnetic sensor 32a. This makes it possible to compensate the magnetic flux when the first magnetic sensor 32a outputs the ON signal. The first and second soft magnetic members 41 and 43 are members of a material with a small coercive force and a large magnetic permeability, and are made of e.g. iron, silicon steel, permalloy, sendust, permendur, soft ferrites, amorphous magnetic alloy, or nanocrystal magnetic alloy.

The first soft magnetic members 41 and the second soft magnetic member 43 are arranged on the sheet 33, facing the detection direction of the first magnetic sensor 32a, with the first magnetic sensor 32a being interposed between the first soft magnetic member 41 and the second soft magnetic member 43. This enables the first magnetic sensor 32a to detect magnetic flux aligned from the first soft magnetic member 41 to the second soft magnetic member 43 or from the second soft magnetic member 43 to the first soft magnetic member 41, thereby achieving improved detection accuracy.

The first and second soft magnetic members 41 and 43 are stuck to the sheet 33 by an adhesive layer 51. The sheet 33 is stuck to the substrate 31 by an adhesive layer 53. The adhesive layers 51 and 53 are e.g. double-sided tape. In this manner, the sheet 33 and the first and second magnetic sensors 32a and 32b are arranged on the substrate 31.

Ends of the first and second soft magnetic members 41 and 43 toward the first magnetic sensor 32a each extend up to the vicinity of the first magnetic sensor 32a, e.g. come into contact with the first magnetic sensor 32a. In cross-sectional view, the first and second soft magnetic members 41 and 43 are arranged to lie between the lower end and upper end in the height direction of the first magnetic sensor 32a. This allows the first magnetic sensor 32a to lie within the magnetic flux aligned between the first soft magnetic member 41 and the second soft magnetic member 43, consequently achieving improved magnetic flux detection accuracy. Moreover, if the detection circuit 32d acting as the detection surface of the first magnetic sensor 32a is level with the first and second soft magnetic members 41 and 43, the magnetic flux detection accuracy can be further improved.

A third soft magnetic member 45 is arranged on one side of the detection direction of the second magnetic sensor 32b. A fourth soft magnetic member 47 is arranged on the other side of the detection direction of the second magnetic sensor 32b. The third and fourth soft magnetic members 45 and 47 align the direction of magnetic flux around the second magnetic sensor 32b. This makes it possible to compensate the magnetic flux when the first magnetic sensor 32b outputs the ON signal. The detection direction of the first magnetic sensor 32a intersects the detection direction of the second magnetic sensor 32b.

The third soft magnetic member 45 and the fourth soft magnetic member 47 are arranged on the sheet 33, facing the detection direction of the second magnetic sensor 32b, with the second magnetic sensor 32b being interposed between the third soft magnetic member 45 and the fourth soft magnetic member 47. This enables the second magnetic sensor 32b to detect magnetic flux aligned from the third soft magnetic member 45 to the fourth soft magnetic member 47 or from the fourth soft magnetic member 47 to the third soft magnetic member 45, thereby achieving improved detection accuracy.

The third and fourth soft magnetic members 45 and 47 are also stuck to the sheet 33 by the adhesive layer 51. Ends of the third and fourth soft magnetic members 45 and 47 toward the second magnetic sensor 32b each extend up to the vicinity of the second magnetic sensor 32b, e.g. come into contact with the second magnetic sensor 32b. In cross-sectional view, the third and fourth soft magnetic members 45 and 47 are arranged to lie between the lower end and upper end in the height direction of the second magnetic sensor 32b. This allows the second magnetic sensor 32b to lie within the magnetic flux aligned between the third soft magnetic member 45 and the fourth soft magnetic member 47, consequently achieving improved magnetic flux detection accuracy. Moreover, if the detection circuit 32d acting as the detection surface of the second magnetic sensor 32b is level with the third and fourth soft magnetic members 45 and 47, the magnetic flux detection accuracy can be further improved.

Since the magnetic sensors 32a and 32b are small members of the order of e.g. 1.5 mm×1.5 mm, if trying to individually attach thereto each of the first to fourth soft magnetic members 41, 43, 45, and 47, workability is poor and it takes time. In the case of this embodiment, however, workability is facilitated due to pre-assembling and easy to handle size.

Since as described above, the configuration is used where the first and second magnetic sensors 32a and 32b are arranged in the opening 33b of the sheet 33 to which the first and second soft magnetic members 41 and 43 and the third and fourth soft magnetic members 45 and 47 are stuck in advance, there can be enhanced the mounting accuracy that ensures the positional relationships between the first and second magnetic sensors 32a and 32b and the first and second soft magnetic members 41 and 43 and between the first and second magnetic sensors 32a and 32b and the third and fourth soft magnetic members 45 and 47.

Furthermore, due to the formation of the slit 33c between the first soft magnetic member 41 and the third soft magnetic member 45 on the sheet 33, it is possible to separately adjust the positions of the first and second soft magnetic members 41 with respect to the first magnetic sensor 32a and the positions of the third and fourth soft magnetic members 45 and 47 with respect to the second magnetic sensor 32b. The opening 33b lies between the first soft magnetic member 41 and the second soft magnetic member 43 and between the third soft magnetic member 45 and the fourth soft magnetic member 47. By allowing an end of at least one of the first, second, third, and fourth soft magnetic members 41, 43, 45, and 47 to lie on the edge of the opening 33b of the sheet 33, the distance between the soft magnetic Member and the magnetic sensor can be reduced, resulting in an improved detection accuracy.

Figure 12:
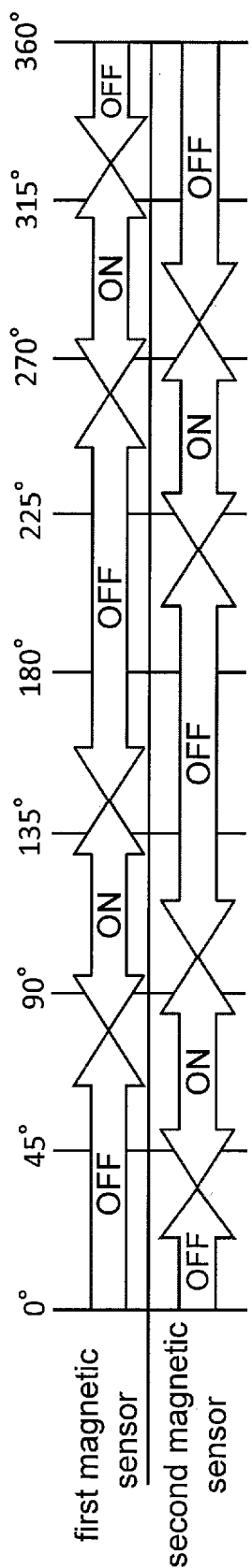
FIG. 12 is an explanatory view showing an output signal issued from the magnetic detecting unit when a normal magnet is rotated.

Referring next to FIGS. 12, description will be given of the amount of rotation of the magnet holder 26 and the magnet 26b and the output signal of the magnetic detecting unit 32. FIG. 12 is an explanatory view showing an output signal issued from the magnetic detecting unit when a normal magnet is rotated.

The combination of the ON and OFF signals output from the first and second magnetic sensors 32a and 32b differs every time the amount of rotation of the magnet holder 26 and the magnet 26b increases by 45 degrees. This enables detection of the amount of rotation of the magnet holder 26 and the magnet 26b.

Figure 13:
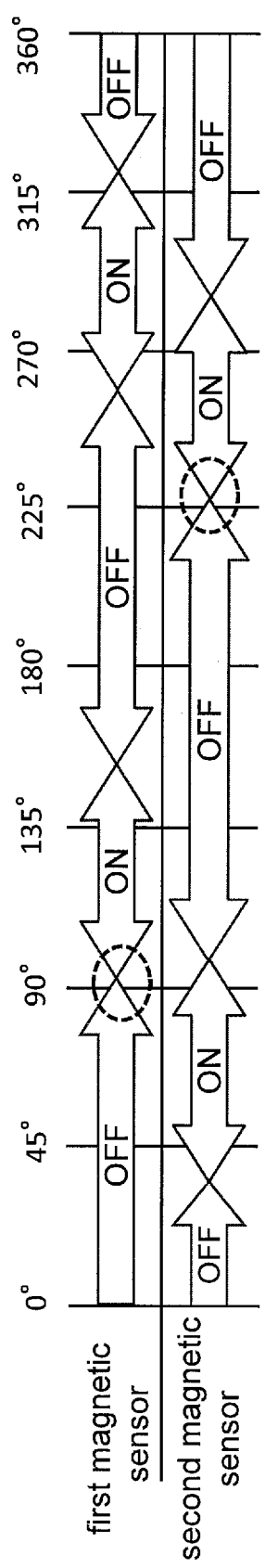
FIG. 13 is an explanatory view showing an output signal issued from the magnetic detecting unit when an abnormal magnet is rotated in the prior art.

In the case that the magnet 26b is of poor quality as shown in FIG. 21, however, magnetic flux from the magnet 26b has a large angular tilt, so that as shown in FIG. 13 the amount of rotation at which the first magnetic sensor 32a outputs the ON signal shifts as a whole in the conventional rotation detector. As a result, when the margin for outputting the ON signal is small, for example, at the amount of rotation of 90 degrees, the magnetic flux does not pass in the detection direction of the first magnetic sensor 32a due to the tilt of the magnetic flux, outputting the OFF signal. Accordingly, since the OFF signal is output from the first magnetic sensor 32a and the ON signal is output from the second magnetic sensor 32b despite the amount of rotation of the magnet holder 26 and the magnet 26b being 90 degrees, the amount of rotation is erroneously detected as being 45 degrees. The second magnetic sensor 32b also undergoes the same when the amount of rotation is 225 degrees, at which the second magnetic sensor 32b originally should output the ON signal but outputs the OFF signal.

Figure 14:
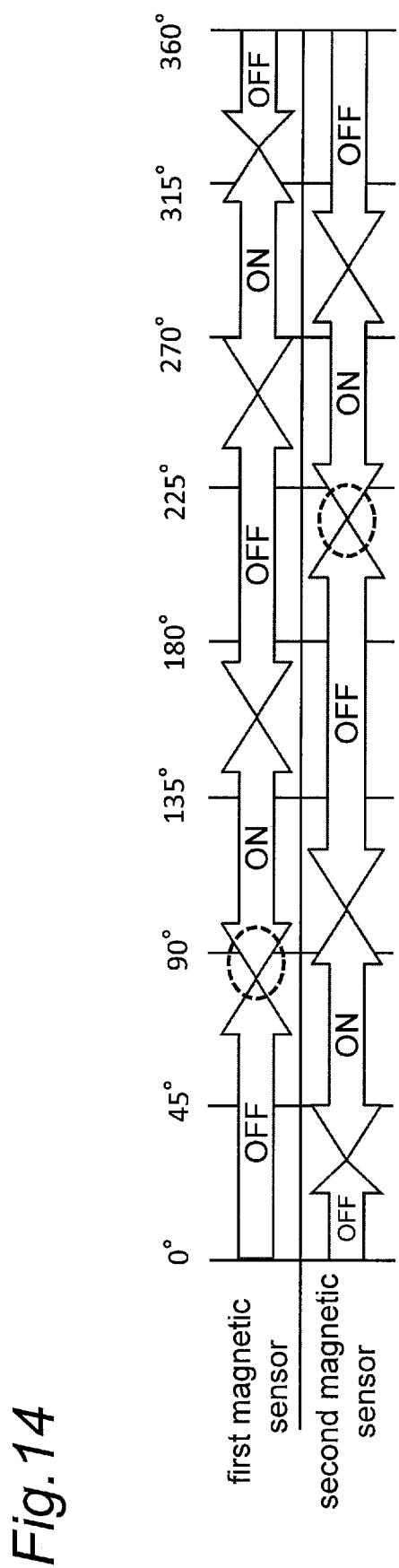
FIG. 14 is an explanatory view showing an output signal issued from the magnetic detecting unit when the abnormal magnet is rotated in an embodiment.

On the contrary, according to the rotation detector 30 of the embodiment, the first, second, third, and fourth soft magnetic members 41, 43, 45, and 47 are correspondingly arranged in the detection direction of each of the first and second magnetic sensors 32a and 32b, so that even when the magnetic flux from the magnet 26b has a large angular tilt, it is possible to align magnetic flux around each magnetic sensor and to guide the magnetic flux of the magnet 26b to the detection direction of each magnetic sensor, enabling the range to output the ON signal to be expanded. In consequence, even at the amount of rotation having a thin margin, the ON signal range is expanded as shown in FIG. 14, allowing the amount of rotation to be accurately detected. For example, even when the amount of rotation of the magnet holder 26 and the magnet 26b is 90 degrees, both the first and second magnetic sensors 32a and 32b output the ON signal, achieving the accurate detection of the amount of rotation. Also, even when the amount of rotation is 225 degrees, the ON signal is output from the second magnetic sensor 32b. In the case that the magnetic flux of the magnet 26b has a larger tilt, the conventional rotation detector may cause a detection failure at the amount of rotation of 45 degrees, 90 degrees, 225 degrees, and 270 degrees where the first and second magnetic sensors 32a and 32b each start to output the ON signal. According to the rotation detector 30 of this embodiment, however, each range to output the ON signal can be expanded, so that the detection failure can be prevented.

1-4. Effects, etc.

As described above, the rotation detector 30 of the embodiment comprises: the dial 21; the magnet 26b that rotates as the dial 21 rotate; the first magnetic sensor 32a that detects the direction of magnetic flux that changes as the magnet 26b rotates; and the first soft magnetic member 41 and the second soft magnetic member 43 that are arranged in one direction and in the other direction respectively of the detection direction of the first magnetic sensor 32a. The rotation axis of the magnet 26b passes through the magnet 26b.

Even if the direction of magnetic flux of the magnet 26b deviates when the magnet 26b rotates around the rotation axis passing through the magnet 26b as the dial 21 rotates, the direction of magnetic flux is aligned by the first soft magnetic member 41 and the second soft magnetic member 43 that are arranged respectively in one direction and the other direction of the detection direction of the first magnetic sensor 32a. This expands the detection range where the first magnetic sensor 32a outputs the ON signal, rendering it possible to reduce the rate of false detection of the first magnetic sensor 32a arising from the deviation of magnetic flux of the magnet 26b.

Figure 15:
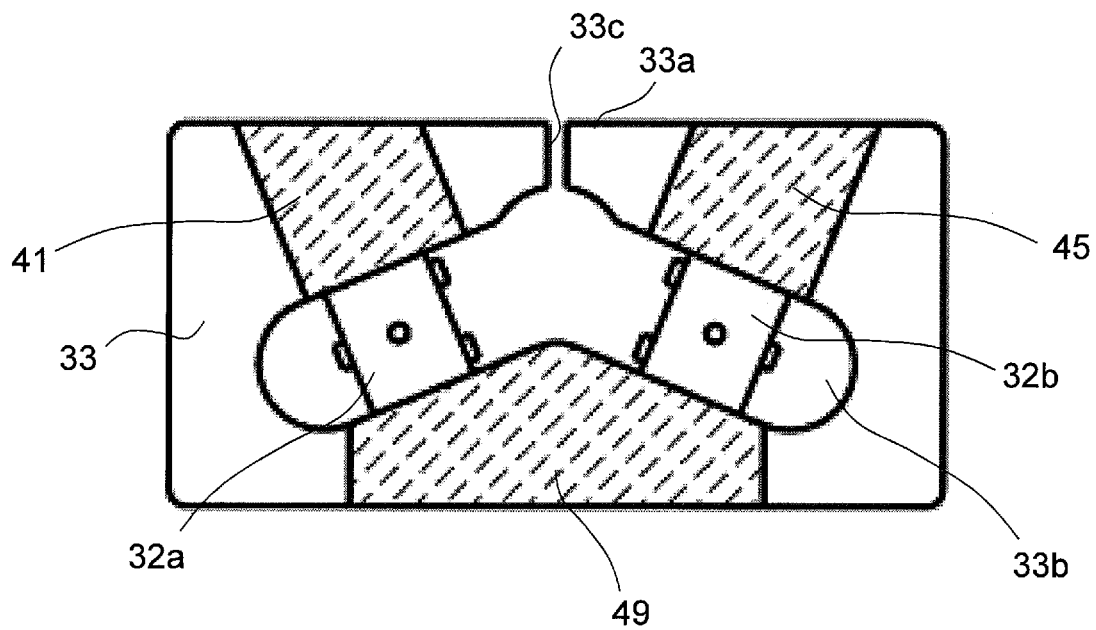
FIG. 15 is a bottom view showing the magnetic sensor and the sheet in a variant.

Variants of the embodiment can employ various forms of first to fourth soft magnetic members 41 to 47. For example, as shown in FIG. 15, on the sheet 33 there may be arranged a fifth soft magnetic member 49 obtained by integrating the second soft magnetic member 43 and the fourth soft magnetic member 47.

Figure 16:
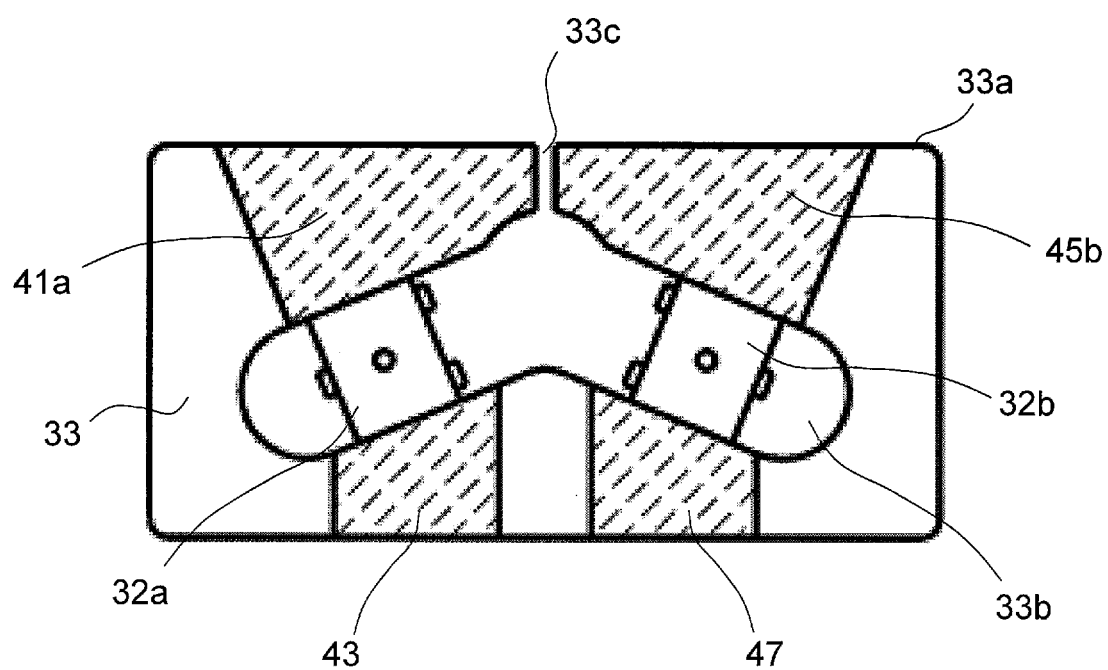
FIG. 16 is a bottom view showing the magnetic sensor and the sheet in a variant.

As a variant of the embodiment, as shown in FIG. 16, a first soft magnetic member 41a may be expanded and arranged until it comes into contact with the slit 33c. Similarly, a third soft magnetic member 45b may also be expanded and arranged until it comes into contact with the slit 33c.

Figure 17:
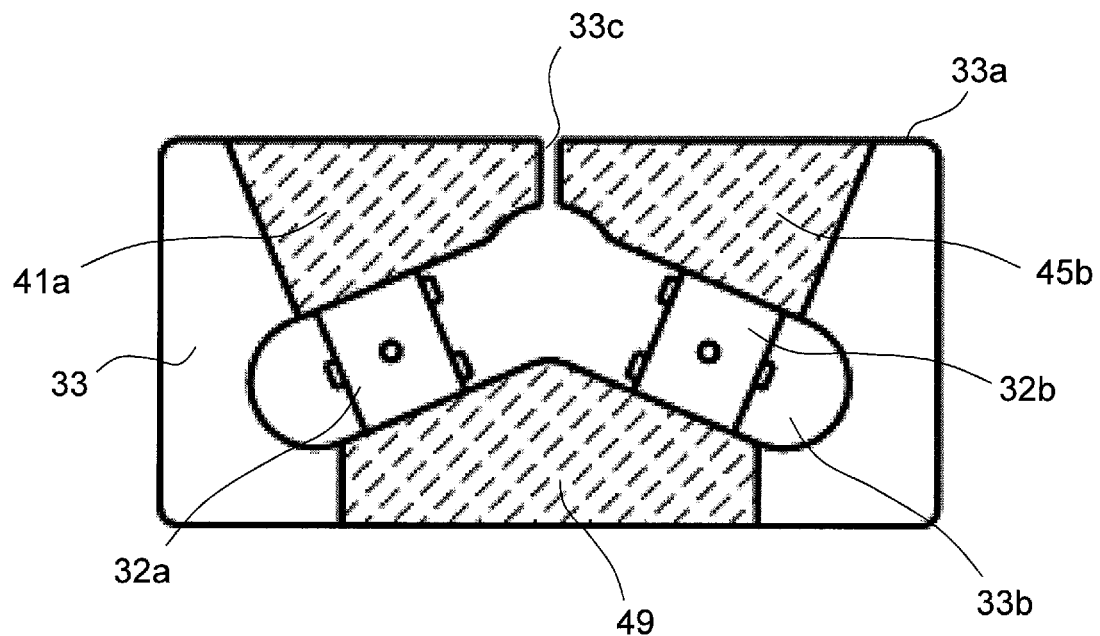
FIG. 17 is a bottom view showing the magnetic sensor and the sheet in a variant.

As another variant of the embodiment, the above two variants may be combined as shown in FIG. 17. That is, on the sheet 33 there may be arranged the fifth soft magnetic member 49 obtained by integrating the second soft magnetic member 43 and the fourth soft magnetic member 47, with the first soft magnetic member 41a and the third soft magnetic member 45b being expanded and arranged until each reaches the slit 33c.

Figure 18:
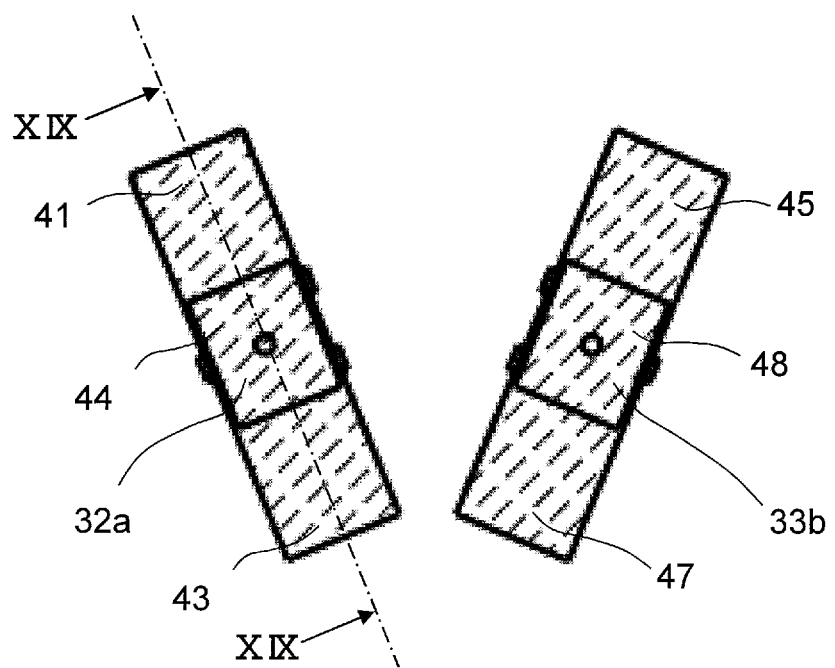
FIG. 18 is a bottom view showing the magnetic sensor and a soft magnetic member in a variant.
Figure 19:
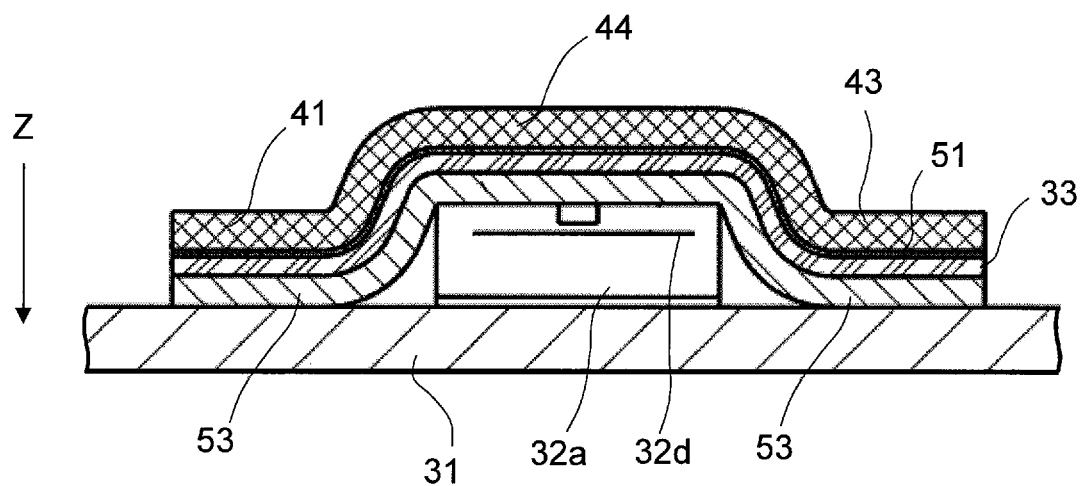
FIG. 19 is a sectional view taken along line XIX of FIG. 18.

As a further variant of the embodiment, as shown in FIGS. 18 and 19, there may be disposed a first coupling member 44 that connects the first soft magnetic member 41 and the second soft magnetic member 43 together. The first coupling member 44 may be a soft magnetic member similar to the first and second soft magnetic members 41 and 43 or may be a member of another material. In the case that the first coupling member 44 is the soft magnetic member similar to the first and second soft magnetic members 41 and 43, the first coupling member 44 may be formed integrally with the first and second soft magnetic members 41 and 43. Moreover, there may be disposed a second coupling member 48 that connects the third soft magnetic member 45 and the fourth soft magnetic member 47 together. The second coupling member 48 may be a soft magnetic member similar to the third and fourth soft magnetic members 45 and 47 or may be a member of another material. In the case that the second coupling member 48 is the soft magnetic member similar to the third and fourth soft magnetic members 45 and 47, the second coupling member 48 may be formed integrally with the third and fourth soft magnetic members 45 and 47. The first coupling member 44 extends confronting the top surface or the bottom surface of the first magnetic sensor 32a, while the second coupling member 48 extends confronting the top surface and the bottom surface of the second magnetic sensor 32b.

Other Embodiments

As above, the above embodiment has been described as an exemplification of the technique disclosed in the present application. However, the technique of the present disclosure is not limited thereto and is applicable to any embodiments appropriately undergoing changes, permutations, additions, omissions, etc. It is also possible to combine the constituent elements described in the above embodiment into a new embodiment. Thus, other embodiments will be exemplified hereinbelow.

In the above embodiment, two magnetic sensors have been used, but this is not limitative. By adjusting the gear ratio and the magnetic sensor(s) as appropriate, the rotation of the rotary dial unit may be detected using one or more magnetic sensors. Two magnetic sensors may be used to detect the tilt angle of the monitor 14 or a single magnetic sensor may be used to configure a device that detects opening/closing of the member caused by rotating operations. Hereby, opening/closing of e.g. the variable-angle monitor 14 may be detected.

Although in the above embodiment, the lens interchangeable digital camera has been used and described as an example of the imaging device, the imaging device may have an integrated lens and body.

As above, the embodiment has been described as the exemplification of the technique of the present disclosure. To that end, the accompanying drawings and the detailed description have been provided.

Accordingly, the constituent elements described in the accompanying drawings and the detailed description may include not only the essential components for problem solving but also components not essential to solve the problem for the purpose of exemplification of the technique. For that reason, immediately from the fact that those unessential components are described in the accompanying drawings and the detailed description, those unessential components should not be construed as being essential.

Since the above embodiment is for the purpose of exemplifying the technique of the present disclosure, various changes, permutations, additions, omissions, etc. can be made within the scope of claims or the scope of equivalents thereof.

The rotation detector according to the present disclosure is applicable to e.g. a rotary dial such as an operation dial of a camera and a volume dial of audio equipment, and a device detecting opening/closing of a member caused by the rotation operation.

What is claimed is:

1. A rotation detector comprising:
a rotary member;
a magnet rotating as the rotary member rotates;
a first magnetic sensor detecting a direction of magnetic flux that changes as the magnet rotates;
a first soft magnetic member and a second soft magnetic member for the first magnetic sensor that are arranged on one side and the other side, respectively, of a detection direction of the first magnetic sensor;
a sheet on which the first soft magnetic member and the second soft magnetic member are arranged confronting each other; and
a substrate on which the sheet and the first magnetic sensor are arranged,
wherein the magnet is not arranged between the first soft magnetic member and the first magnetic sensor and between the second soft magnetic member and the first magnetic sensor,
the sheet has an opening,
the first magnetic sensor is arranged in the opening, and
the opening lies between the first soft magnetic member and the second soft magnetic member.

2. The rotation detector of claim 1, wherein
the first magnetic sensor is arranged such that the detection direction of the first magnetic sensor is parallel to a plane on which the magnet rotates.

3. The rotation detector of claim 2, comprising:
a sheet on which the first soft magnetic member and the second soft magnetic member are arranged confronting each other; and
a substrate on which the sheet and the first magnetic sensor are arranged, wherein
the sheet has an opening, wherein
the first magnetic sensor is arranged in the opening, and wherein
the opening lies between the first soft magnetic member and the second soft magnetic member.

4. An imaging device comprising the rotation detector of claim 1.

5. A rotation detector comprising:
a rotary member;
a magnet rotating as the rotary member rotates;
a first magnetic sensor detecting a direction of magnetic flux that changes as the magnet rotates;
a second magnetic sensor detecting a direction of magnetic flux that changes as the magnet rotates;
a first soft magnetic member and a second soft magnetic member for the first magnetic sensor that are arranged on one side and the other side, respectively, of a detection direction of the first magnetic sensor; and a third soft magnetic member and a fourth soft magnetic member for the second magnetic sensor that are arranged on one side and the other side, respectively, of a detection direction of the second magnetic sensor, the detection direction of the first magnetic sensor intersecting the detection direction of the second magnetic sensor.

6. The rotation detector of claim 5, wherein the first magnetic sensor is arranged such that the detection direction of the first magnetic sensor is parallel to a plane on which the magnet rotates, and wherein the second magnetic sensor is arranged such that the detection direction of the second magnetic sensor is parallel to the plane on which the magnet rotates.

7. The rotation detector of claim 6, comprising:

a sheet on which the first soft magnetic member and the second soft magnetic member are arranged confronting each other and on which the third soft magnetic member and the fourth soft magnetic member are arranged confronting each other; and a substrate on which the sheet and the first and the second magnetic sensors are arranged, wherein the sheet has an opening, wherein the first and the second magnetic sensors are arranged in the opening, and wherein the opening lies between the first soft magnetic member and the second soft magnetic member and between the third soft magnetic member and the fourth soft magnetic member.

8. The rotation detector of claim 5, comprising:

a sheet on which the first soft magnetic member and the second soft magnetic member are arranged confronting each other and on which the third soft magnetic member and the fourth soft magnetic member are arranged confronting each other; and a substrate on which the sheet and the first and the second magnetic sensors are arranged, wherein the sheet has an opening, wherein the first and the second magnetic sensors are arranged in the opening, and wherein the opening lies between the first soft magnetic member and the second soft magnetic member and between the third soft magnetic member and the fourth soft magnetic member.

9. The rotation detector of claim 8, wherein the sheet includes a slit connecting an outer edge of the sheet and the opening of the sheet, and wherein the slit is arranged between the first soft magnetic member and the third soft magnetic member.

10. The rotation detector of claim 9, wherein an end of at least one of the first, second, third, and fourth soft magnetic members lies on an edge of the opening.

11. The rotation detector of claim 8, wherein an end of at least one of the first, second, third, and fourth soft magnetic members lies on an edge of the opening.

12. The rotation detector of claim 5, wherein in a cross-sectional view, the first and second soft magnetic members are arranged so as to lie between lower and upper ends in the height direction of the first magnetic sensor, and wherein in the cross-sectional view, the third and fourth soft magnetic members are arranged so as to lie between lower and upper ends in the height direction of the second magnetic sensor.

13. An imaging device comprising the rotation detector of claim 5.

* * * * *